(12) United States Patent
Grechishkin et al.

(10) Patent No.: US 11,733,864 B1
(45) Date of Patent: *Aug. 22, 2023

(54) SMART KEYBOARD

(71) Applicant: PARALLELS INTERNATIONAL GmbH, Schaffhausen (CH)

(72) Inventors: Alexander Grechishkin, Moscow (RU); Nikolay Dobrovolskiy, Moscow (RU); Serguei M. Beloussov, Singapore (SG)

(73) Assignee: Parallels International GmbH, Schaffhausen (CH)

( * ) Notice: Subject to any disclaimer, the term of this patent is extended or adjusted under 35 U.S.C. 154(b) by 264 days.

This patent is subject to a terminal disclaimer.

(21) Appl. No.: 17/237,564

(22) Filed: Apr. 22, 2021

Related U.S. Application Data

(63) Continuation of application No. 16/208,208, filed on Dec. 3, 2018, now Pat. No. 10,990,280.

(51) Int. Cl.
*G06F 3/0489* (2022.01)
*H03K 17/967* (2006.01)
(Continued)

(52) U.S. Cl.
CPC ............ *G06F 3/0489* (2013.01); *G06F 3/023* (2013.01); *G06F 3/0481* (2013.01); *H03K 17/967* (2013.01)

(58) Field of Classification Search
CPC ...... G06F 3/0489; G06F 3/0481; G06F 3/023; G06F 3/04886; G06F 3/0482;
(Continued)

(56) References Cited

U.S. PATENT DOCUMENTS 6,208,954 B1 3/2001 Houtchens
6,212,572 B1 4/2001 Aydin et al.
(Continued)

FOREIGN PATENT DOCUMENTS

AU 2010236943 A1 * 11/2011 ............. G07F 17/32
AU 2013213728 A1 * 8/2013 ......... G06Q 20/3674
(Continued)

OTHER PUBLICATIONS

Linux/UNIX system programming training, http://man7.org/linux/man-pages/man2/select2.html, 9 pages, [retrieved from the internet on Jul. 19, 2018].

*Primary Examiner* — Steven P Sax
(74) *Attorney, Agent, or Firm* — Rosenberg, Klein & Lee

(57) ABSTRACT

The subject matter of this specification describes a method that includes determining when to send a user selection of a first key on a keyboard to an operating system, where the operating system supports shortcut key combinations. The device identifies the user selection of the first key, as input for an application. The device determines that the first key is part of a shortcut key combination. The processing device determines whether a cursor is visible in a user interface provided by the application. Upon determining that the cursor is visible in the user interface, the device waits for another user selection of one or more remaining keys of the shortcut key combinations before sending the first key to the operating system. Upon determining that the cursor is not visible in the user interface, the device sends the first key to the operating system without waiting for another user selection.

4 Claims, 6 Drawing Sheets

(51) Int. Cl.
*G06F 3/023* (2006.01)
*G06F 3/0481* (2022.01)

(58) Field of Classification Search
CPC .. G06F 3/04812; G06F 3/0484; G06F 3/0488; G06F 3/02; G06F 21/53; H03K 17/967; H04M 1/72; H04M 1/2748; G06T 11/206; G06Q 20/32
See application file for complete search history.

(56) References Cited

U.S. PATENT DOCUMENTS

| | | | | |
|---|---|---|---|---|
| 10,129,211 | B2 * | 11/2018 | Heath | G06Q 30/02 |
| 11,036,344 | B1 * | 6/2021 | Portelli | G06F 3/0481 |
| 11,042,257 | B1 * | 6/2021 | Sciberras | G06F 11/3668 |
| 11,169,831 | B1 * | 11/2021 | Semenov | H04L 67/75 |
| 11,233,853 | B1 * | 1/2022 | Gafa | H04L 67/141 |
| 2008/0104025 | A1 | 5/2008 | Dharamshi et al. | |
| 2008/0172445 | A1 | 7/2008 | Zaidelson et al. | |
| 2011/0029694 | A1 * | 2/2011 | Blinzer | G06F 12/0638 710/9 |
| 2013/0024875 | A1 | 1/2013 | Wang et al. | |
| 2013/0125052 | A1 * | 5/2013 | Baird | G06F 3/0482 715/810 |
| 2014/0309806 | A1 * | 10/2014 | Ricci | G05D 23/1917 701/1 |
| 2015/0271294 | A1 | 9/2015 | Ma | |
| 2015/0287043 | A1 * | 10/2015 | Michaelis | G16H 50/20 705/317 |
| 2019/0310837 | A1 * | 10/2019 | Zmijewski | G06F 16/986 |

FOREIGN PATENT DOCUMENTS

| | | | | |
|---|---|---|---|---|
| BR | 102014006116 | A2 * | 11/2015 | G06F 8/52 |
| CA | 2854142 | A1 * | 5/2013 | G06F 16/958 |
| CA | 2817652 | A1 * | 12/2013 | G06F 3/048 |
| CA | 2817660 | A1 * | 12/2013 | G06F 3/048 |
| CA | 2792336 | C * | 7/2018 | G06F 3/04842 |
| EP | 2927831 | A1 * | 10/2015 | G06F 19/3406 |
| FR | 2900786 | A1 * | 11/2007 | H04L 67/04 |

* cited by examiner

US 11,733,864 B1

SMART KEYBOARD

CROSS-REFERENCE TO RELATED APPLICATIONS

This application claims the benefit of priority as a continuation application of U.S. Ser. No. 16/208,208 filed Dec. 3, 2018 entitled "Smart Keyboard", the entire contents of which are incorporated herein by reference.

TECHNICAL FIELD

This disclosure generally relates to automatic detection of shortcut key support in applications. More specifically, the disclosure relates to determining whether an application supports shortcut keys and determining, upon identifying a first key, whether to wait or immediately send the first key to the application.

BACKGROUND

Computer systems, such as personal computers, often include a keyboard as a peripheral device. The keyboard may function as a primary input device for users to provide input for running applications. The keyboard allows users to input letters, numbers, and other symbols that can serve as commands or be used to type text. When a key on the keyboard is pressed, hardware within the keyboard may generate a specific signal for the specific key pressed. Signals generated from keyboards may vary depending on the type of keyboard used. The computer system may include a keyboard application, such as driver software, that is running on top of an operating system and is configured to translate the incoming signals from the keyboard into a specific key code. For example, if a user presses the A-key, then the keyboard may generate a specific signal for the A-key, which is translated by driver software into a key code representing the A-key. The driver software may then provide the A-key code to the operating system which may send the A-key code to the appropriate application.

In some instances, keyboard input received by the driver software may be translated into a shortcut keyboard command. A shortcut keyboard command may represent a combination of keyboard inputs that are translated into a special input command. For example, a combination of pressing the control key and the O-key may be translated into an open file command. The driver software may determine the translated open file command and may provide the command to the operating system to execute the open file command.

DETAILED DESCRIPTION

Figure 1A:
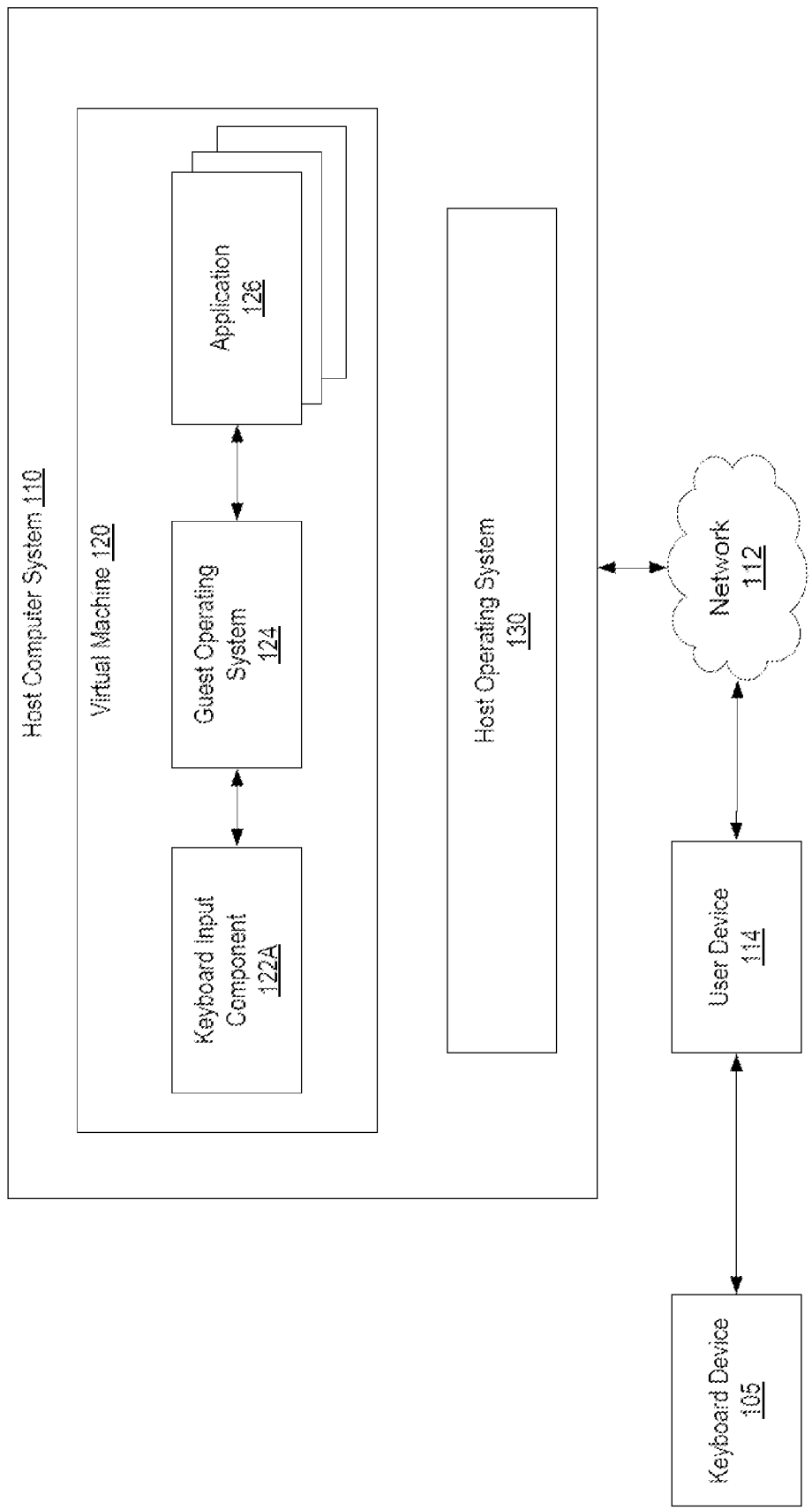
FIG. 1A depicts a high-level component diagram of a host computer system running a virtual machine in which the methods and systems described herein may be implemented.

In a computing system with a keyboard receiving user inputs, it is often advantageous to enable shortcut keyboard commands that facilitate efficient performance of specialized operations. Computing systems typically employ device drivers that provide an interface to hardware devices such as the keyboard. A device driver, such as a keyboard driver, is software executed by the operating system that is enabled to receive signals from the keyboard and translate the signals received from the keyboard into input that is recognizable by the operating system.

The keyboard driver may be configured to translate signals representing a combination of keyboard inputs into a shortcut key combination that may represent a special command. The keyboard driver may access a keyboard-remapping table stored in memory, which contains mappings between various shortcut keys and their intended commands. For example, the keyboard-remapping table may contain entries specifying that the combination of the control key and the O-key translates to a file open command and the combination of the ALT-key and the TAB-key translates to a command to switch between application-level windows within the operating system.

Typically, shortcut keys are initialized by pressing a combination of keys on the keyboard. However, simultaneously receiving keystrokes for multiple keys pressed on the keyboard may not be possible. In many cases, it is likely that the user, when intending to activate a shortcut key combination, presses one key after another, in quick succession. The keyboard device may be equipped with a processor that is configured to read pressed keys as keystrokes and send signals of received keystrokes to the computer system via a serial link. Therefore, the simultaneous pressing of two or more keys is usually sent to the computer system as a series of individual keystrokes.

The keyboard driver is typically configured to determine whether a series of received keystrokes should be considered as a "simultaneous" pressing of a combination of keys by determining if two or more keystrokes are received within a predefined period of time. When the keyboard driver receives a signal from the keyboard, the keyboard driver translates the signal into a first key code, herein referred to as a first key. The keyboard driver determines whether the first key is part of a shortcut key combination within the keyboard-remapping table. If the first key is part of a shortcut key combination in the keyboard-remapping table, then the keyboard driver may wait, during a predefined period of time, for a second signal, which may be translated into a second key, to determine whether the second key is the remaining key of the shortcut key combination in the keyboard-remapping table. If the second key is the remaining key of the shortcut key combination in the keyboard-remapping table, then the keyboard driver may translate the shortcut key combination of the first and second keys into a mapped command corresponding to the shortcut key combination for the first and second keys. For example, if the first key received is the CONTROL-key, which is part of one of the shortcut key combinations in the keyboard-remapping table, then the keyboard driver may wait, during a predefined period of time, for a second signal that may correspond to the remaining key of the above shortcut key combination. If the second key is the C-key and is received within the predefined period of time, then the keyboard driver may determine that the combination of the CONTROL-key and the C-key corresponds to a shortcut key combination that maps to the copy command. The keyboard driver may then send the copy command or any other remapped key combination to the operating system.

Applications that have text editing capabilities may benefit from shortcut key combinations. Many applications, such as a gaming application or a Computer-aided Drawing (CAD) application, may have different application modes such as a text editing mode and a graphics mode. A text editing mode may represent a user interface that allows the user to input text via the keyboard device. A graphics mode may represent a user interface that displays graphical elements and allows the user to interact with the displayed graphical elements.

However, typically the keyboard driver does not differentiate between the different modes of an application. If a user, while in the graphics mode of an application, inputs a keystroke for a first key from a shortcut key combination in the keyboard-remapping table but does not intend to input a second key from the shortcut key combination, the keyboard driver may still wait for input of the second key during the predefined period of time, regardless of whether the user intends for the first key to be part of a shortcut key combination or not. As a result, keyboard inputs that correspond to keys that make up shortcut key combinations in the keyboard-remapping table may be delayed from being sent to the operating system for the predefined period of time. These delays may negatively impact a user experience with an application running on the computer system. For example, a user may be playing a game via a gaming application that uses player controls of "ALT" for jump and "COTROL" for a fire action while in gameplay mode (graphics mode), or any other key that is part of a shortcut key combination in the keyboard-remapping table. If the keyboard driver implements the keyboard-remapping table, which includes shortcut key combinations that include the "ALT" and "CONTROL" keys, then when the keyboard driver receives keyboard input corresponding to either the "ALT" or "CONTROL" keys, the keyboard driver may wait for the predefined period of time to determine if a second keyboard input is detected and whether the second keyboard input corresponds to a possible shortcut key combination, before providing the first key to the operating system for the gaming application. This delay in sending the first key input may adversely affect gameplay. For instance, the user's character may not jump (ALT-key) or perform a fire action (CONTROL-key) at the moment the key is pressed because of the delay from the keyboard driver. Likewise, a delay in performing any other key operation that is part of a shortcut key combination may negatively affect the user's experience.

Delays in sending keyboard inputs to the operating system are not limited to gaming applications. Other applications may implement similar graphic modes with customized keyboard inputs and may be adversely affected by keyboard input delays. For example, the user experience for a CAD program, which may have specialized commands associated with specific keys may be adversely affected by keyboard input delays.

Aspects of the present disclosure address the above and other deficiencies by implementing logic to determine when to send keyboard input to the operating system of the computer system. In particular, a software component may be implemented to determine whether a cursor is visible in a user interface of an application (which may indicate, for example, whether the current mode of the application supports shortcut key commands or has its own key remapping logic). If the cursor is visible in the user interface of the application (which may indicate that the current mode of the application does support shortcut key commands or has its own key remapping logic), then the software component may wait for another user selection of a second key to determine whether the first and second keys map to a shortcut key combination. If the cursor is not visible in the user interface of the application (which may indicate that the current mode of the application does not support shortcut key commands or does not have its own key remapping logic), then the software component may immediately provide the first key to the operating system without waiting to receive a second key within a configured period of time.

In an implementation, the software component, such as a keyboard driver or other virtual machine keyboard emulation software, may be configured to determine whether a cursor is visible within the user interface of the application. User interfaces of applications that display the cursor may use specific commands that are mapped to shortcut key combinations in the keyboard-remapping table. For example, if an application implements a user interface that displays the cursor, then it may be determined that the application supports shortcut key combinations, such as copy (CONTROL+C) and paste (CONTROL+V) or any other remapped key combination, and the software component would be configured to determine whether the received multiple key inputs are to be translated into the mapped command. If however, an application implements a user interface that does not display the cursor, then the software component may conclude that the application is in a mode that does not have explicit commands mapped to shortcut key combinations or its own key remapping logic and the software component may the waiting time for a second keyboard input and may immediately provide the first keyboard input to the operating system.

The software component may be configured to determine for different application modes whether to wait for a second key or to immediately send the first key to the operating system. In an embodiment, the software component may determine support for shortcut key combinations by evaluating the current state of a system cursor. The system cursor may refer to a cursor icon that may be displayed within the operating system and running applications. For example, the system cursor may refer to the arrow icon or a mouse pointer within Windows, Mac, or Linux operating systems. Other examples of a system cursor may refer to the blinking keyboard cursor within word processing applications such Microsoft Word. Applications that do not rely on input through the system cursor may set the cursor state to hidden or invisible for the purposes of hiding the system cursor from view. For example, during a gameplay mode for a gaming application, the gaming application may choose to hide the system cursor in order to not distract the user during gameplay with a mouse pointer moving around the game interface. Instead, the gameplay mode of the gaming application may implement its own custom cursor designed for user input during gameplay.

In an embodiment, the software component may use the current state of the system cursor as an indicator of whether a currently active mode of an application uses shortcut key combinations based upon whether the currently active mode of the application displays the system cursor.

Upon determining that the currently active mode of the application uses shortcut key combinations, the software component may wait for a second keyboard event corresponding to user selection of a second key to determine whether the first key and the second key make up a shortcut key combination. As described, combinations of keys are not simultaneously sent from the keyboard device to the computer system, instead combinations of keys are sent as a series of individual signals. In an embodiment, the software component may be configured to wait, after receiving a first key, for a predefined period of time, to receive a second key as input in order to consider the first and second key as a combination of keys for a shortcut key combination. For example, if a second key is detected within the predefined period of time, then the software component may evaluate whether the first and second key make up a shortcut key combination. If however, the second key is detected after the predefined period of time has been exceeded, then the software component may treat the first and second key as separate keystrokes and may individually send the first key and the second key to the operating system.

In an embodiment, if the software component determines that the second key has been received within the specific duration of time, then the software component may determine, using the keyboard-remapping table whether the first key and the second key map to a shortcut key combination. If the first key and second key map to a specific shortcut key combination, then the software component may send the mapped shortcut key command to the operating system.

In another embodiment, if the software component determines that the second key has been received within the specific duration of time but determines that the combination of the first key and second key do not map to a shortcut key combination in the keyboard-remapping table, then the software component may individually send the first key and the second key to the operating system.

In an embodiment, the software component may be implemented as part of a keyboard driver within an operating system of a standalone computer or as part of emulation software, such as a virtual machine driver of a host computer system running one or more virtual machines.

Accordingly, aspects of the present disclosure provide advantages of determining whether an application mode supports shortcut keyboard commands and facilitates efficient translation of keyboard signals into the intended user input. If the currently active application mode does not support shortcut keyboard commands or does not have its own key remapping logic, then detected keyboard signals may be translated into user input that may be efficiently provided to the currently active application without waiting to determine whether the detected input is part of a shortcut keyboard command.

FIG. 1A illustrates schematically an exemplary high-level component diagram of a host computer system running a virtual machine in which the methods and systems described herein may be implemented. Software and hardware components of the host computer system are shown in FIG. 1A for illustrative purposes only, and the scope of the present disclosure is not limited to the architecture shown in FIG. 1A. Various other software or hardware components may be omitted from FIG. 1A for clarity. The systems and methods described herein may be implemented by hardware (e.g., general purpose and/or specialized processing devices, and/or other devices and associated circuitry), software (e.g., instructions executable by a processing device), or a combination thereof. Various aspects of the above referenced disclosure are described in details below by way of examples, rather than by way of limitation.

Host computer system 110 may refer to a physical computer system that implements one or more virtual machines. The host computer system 110 may comprise of a host operating system 130, and a virtual machine 120. The host computer system 110 may be connected via a network 112 to a user device 114 that has an attached keyboard device 105. The keyboard device 105 may represent a physical keyboard device. The host operating system 130 may represent the operating system running on the host computer system 110. The host operating system 130 may manage hardware resources of the host computer system and provide functions such as inter-process communication, scheduling, memory management, and so forth.

The virtual machine 120 may emulate an operating system such as Windows, Mac OS, Linux, or any other operating system and may execute programs as though the virtual machine 120 was a physical machine. The virtual machine 120 may comprise a keyboard input component 122A, a guest operating system 124, and applications 126. Applications 126 may represent one or more applications running within the virtual machine 120 and providing one or more user interfaces to be presented on the user device 114. The guest operating system 124 may be configured to handle execution of application threads associated with applications 126, as well as virtual machine functions within the virtual machine 120. It should be noted that although, for simplicity, a single virtual machine 120 is depicted in FIG. 1A, host computer system 110 may host a plurality of virtual machines 120.

In an embodiment, keyboard input component 122A may represent a software component configured to receive signals from the keyboard device 105 (e.g., directly from the user device 114 or via the host operating system 130) and translate the received signals into key inputs for the guest operating system 124 and applications 126. Examples of the keyboard input component 122A may include virtual machine keyboard emulation software and a virtual machine keyboard driver. The keyboard input component 122A may detect a first key input and determine whether to wait for a second key input or immediately send the first key input to the guest operating system 124 by determining whether the currently active mode of application 126 uses shortcut key combinations. The keyboard input component 122A may determine whether the currently active mode of application 126 uses shortcut key combinations or has its own key remapping logic by determining whether the system cursor is currently visible within a user interface displayed by the currently active mode of application 126 by determining the cursor state of the system cursor.

In an implementation, the keyboard input component 122A may determine the cursor state of the system cursor by implementing an event handler, such as a listener process, to listen for system calls executed by application 126 to update the cursor state of the system cursor. For example, the listener process may detect system calls to the guest operating system 124 that update the state of the system cursor. If the system call detected by the listener specifies setting the system cursor state to hidden, then the keyboard input component 122A may determine that the current state of the system cursor is hidden. The keyboard input component 122A may then conclude that the current mode of application 126 does not use shortcut key combinations or its own key remapping logic. If however, the system call detected by the listener specifies setting the system cursor state to visible, then the keyboard input component 122A may determine that the current state of the system cursor is visible. The keyboard input component 122A may then conclude that the current mode of application 126 may use shortcut key combinations or its own key remapping logic.

In other implementations, the keyboard input component 122A may determine the state of the system cursor by performing a system call to retrieve the current cursor state from the guest operating system 124. For example, the keyboard input component 122A may call a guest operating system function such as a Windows GetCursorInfo function. The GetCursorInfo function call may return the current state of the system cursor. The keyboard input component 122A may then determine whether the current mode of application 126 uses shortcut key combinations or its own key remapping logic based upon the output of the GetCursorInfo function call.

Figure 1B:
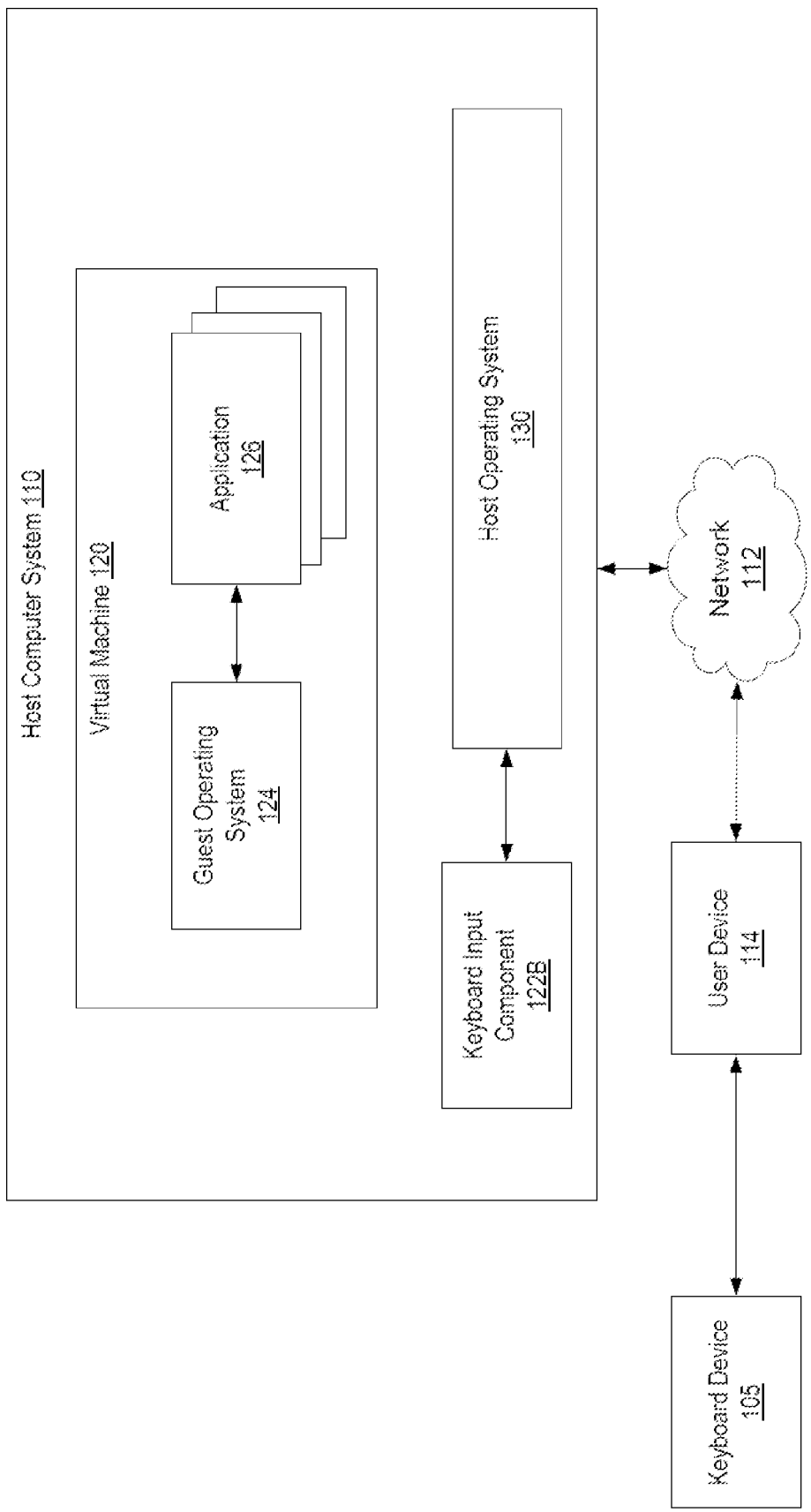
FIG. 1B depicts a high-level component diagram of a host computer system running a virtual machine in which the methods and systems described herein may be implemented.

FIG. 1B illustrates schematically another exemplary high-level component diagram of the host computer system running a virtual machine in which the methods and systems described herein may be implemented. The host computer system 110 may comprise the same or similar components as displayed in FIG. 1A, including the host operating system 130, the virtual machine 120, the guest operating system 124, and application 126. The host computer system 110 may be connected via a network 112 to a user device 114 that has an attached keyboard device 105. The network 112 may be, for example, can be Internet, LAN, or a telecommunications network. In an embodiment, keyboard input component 122B may represent a software component configured to receive signals from the keyboard device 105 and translate the received signals into key inputs for the host operating system 130. The host operating system 130 may then send the key inputs to the guest operating system 124. Keyboard input component 122B may implement functionality similar to keyboard input component 122A.

Figure 1C:
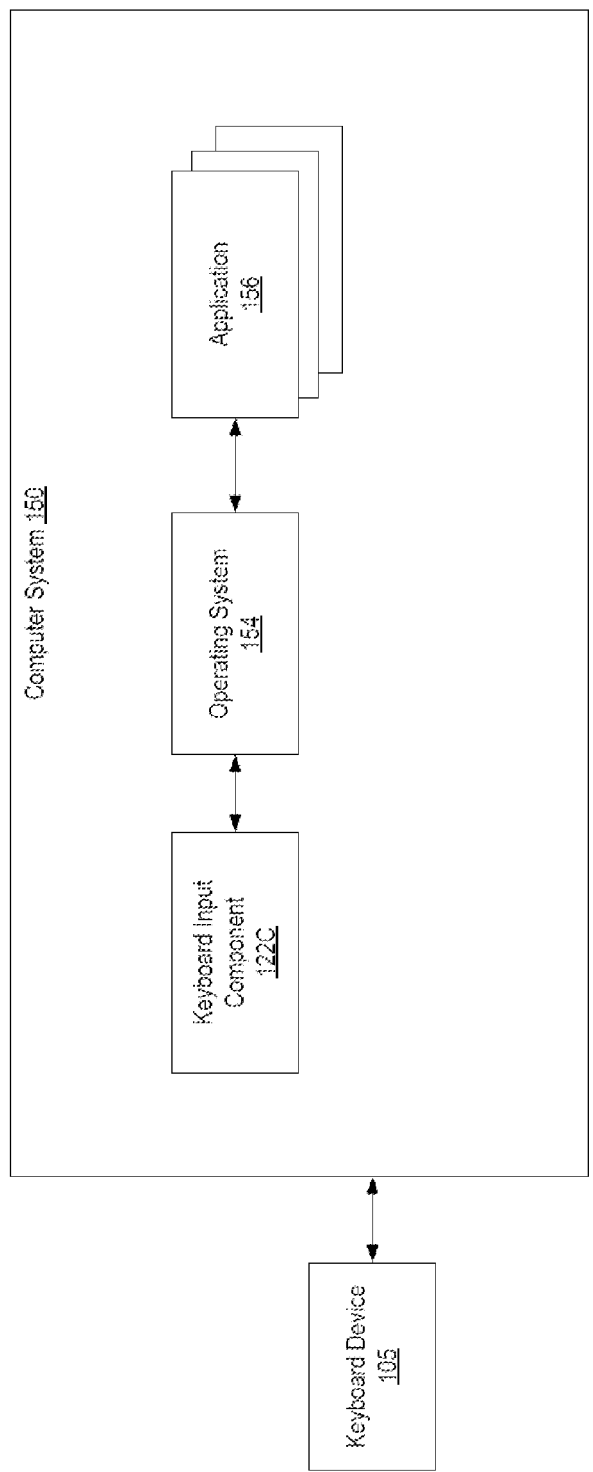
FIG. 1C depicts a high-level component diagram of a stand alone computer system in which the methods and systems described herein may be implemented.

FIG. 1C illustrates schematically an exemplary high-level component diagram of a standalone computer system running applications in which the methods and systems described herein may be implemented. Software and hardware components of the standalone computer system are shown in FIG. 1B for illustrative purposes only, and the scope of the present disclosure is not limited to the architecture shown in FIG. 1B. Various other software or hardware components may be omitted from FIG. 1B for clarity. The systems and methods described herein may be implemented by hardware (e.g., general purpose and/or specialized processing devices, and/or other devices and associated circuitry), software (e.g., instructions executable by a processing device), or a combination thereof. Various aspects of the above referenced disclosure are described in details below by way Of examples, rather than by way of limitation.

Computer system 150 may refer to a standalone computer system that implements an operating system and one or more applications. The computer system 150 may comprise of operating system 154, applications 156, keyboard input component 122C, and the attached keyboard device 105. The keyboard device 105 may represent a physical keyboard device attached to the computer system 150. The operating system 154 may represent the operating system running on the computer system 150. The operating system 154 may manage hardware resources of the computer system and provide functions such as inter-process communication, scheduling, memory management, and so forth. Applications 156 may represent one or more applications running on the operating system 154.

In an embodiment, keyboard input component 122C may represent a software component configured to receive signals from the keyboard device 105 and translate the received signals into key inputs for the operating system 154 and applications 156. An example of the keyboard input component 122C may include a keyboard driver. Keyboard input component 122C may implement functionality similar to keyboard input component 122A and 122B. For example, keyboard input component 122C may determine whether the currently active application 156 supports shortcut key combinations or has its own key remapping logic by determining whether the system cursor is currently visible by determining the cursor state of the system cursor.

Figure 2:
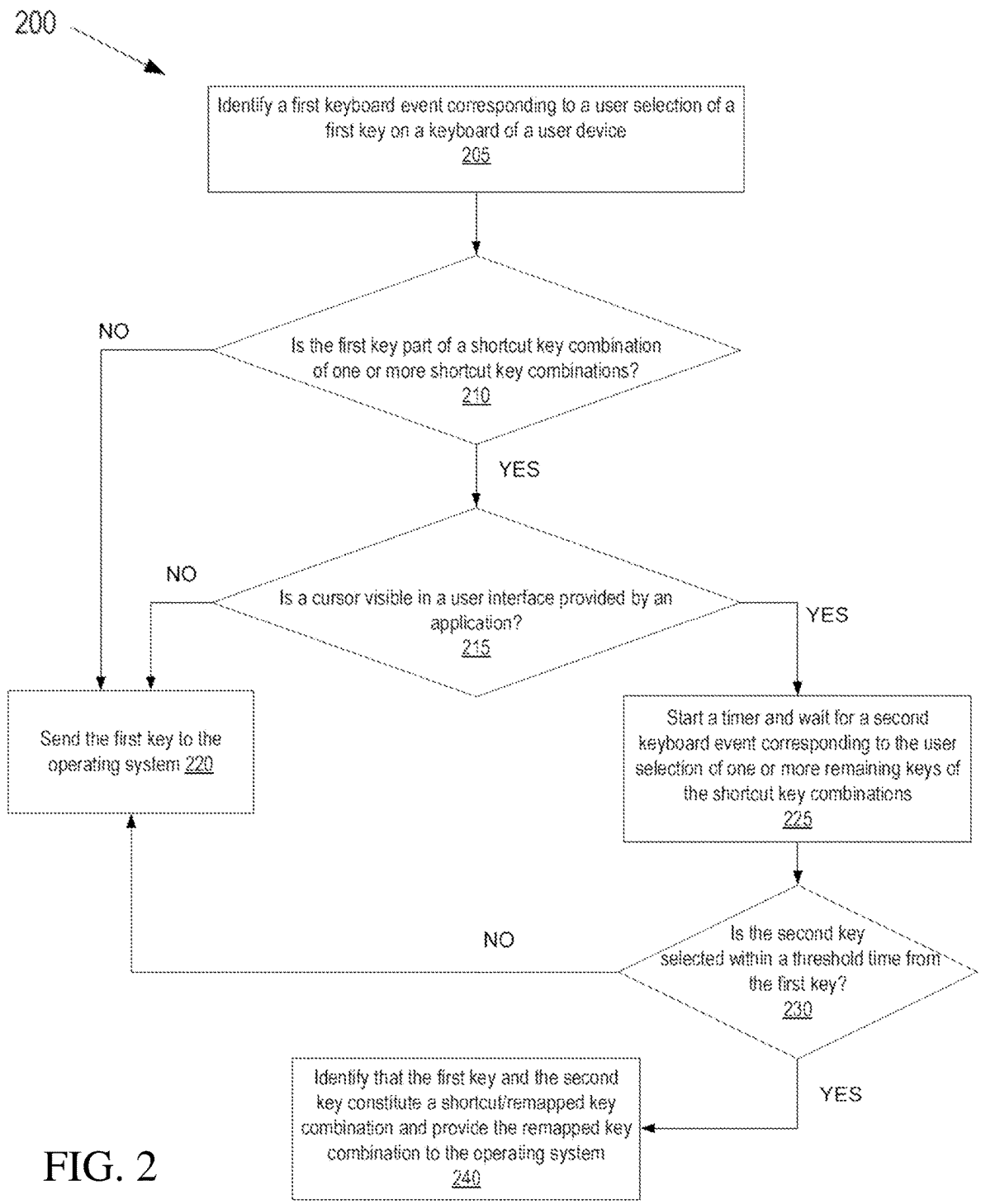
FIG. 2 depicts a flow diagram of one illustrative example of a method for determining when to send a first user input to an operating system, in accordance with one or more implementations of the present disclosure.

FIG. 2 depicts a flow diagram of one illustrative example of a method 200 for determining when to send a first user input to an operating system. Method 200 and/or each of its individual functions, routines, subroutines, or operations may be performed by one or more processing units of either the host computing system 110 or the computer system 150 implementing the method. In certain implementations, method 200 may be performed by a single processing thread. Alternatively, method 200 may be performed by two or more processing threads, each thread executing one or more individual functions, routines, subroutines, or operations of the method. In an illustrative example, the processing threads implementing method 200 may be synchronized (e.g., using semaphores, critical sections, and/or other thread synchronization mechanisms). Alternatively, the processing threads implementing method 200 may be executed asynchronously with respect to each other.

For the purposes of clarity, the operations for method 200 are described using components depicted in FIG. 1A. However, the operations of method 200 may be performed by components depicted in FIGS. 1B and 1C as well. For example, operations performed by the keyboard input component 122A within the host computer system 110 may be similarly performed by keyboard input component 122B and by keyboard input component 122C within the computer system 150.

At block 205, processing logic may identify a first keyboard event corresponding to a user selection of a first key on a keyboard of a user device. In an embodiment, processing logic may be implemented by a processor on the host computer system 110 of Figure IA. For example, processing logic may be implemented via a keyboard input component 122A which is a part of (e.g., a plugin) or a supplement to the guest operating system 124. The first keyboard event corresponding to the user selection of the first key may originate from keyboard device 105 as a signal and may be passed to the keyboard input component 122A by the user device 114 directly or via the host operating system 130.

In another embodiment, processing logic may be implemented by a processor on the host computer system 110 of FIG. 1B. For example, processing logic may be implemented via a keyboard input component 122B which is a part of (e.g., a plugin) or a supplement to the host operating system 130. The first keyboard event corresponding to the user selection of the first key may originate from keyboard device 105 as a signal and may be passed to the keyboard input component 122B by the user device 114.

In yet another embodiment, processing logic may be implemented by a processor on the user device represented as computer system 150 in figure IC. For example, processing logic may be implemented via a keyboard input component 122C which is a part of (e.g., a plugin) or a supplement to the operating system 154 of the user device 150. The first keyboard event corresponding to the user selection of the first key may originate from keyboard device 105 as a signal and may be intercepted by the keyboard input component 122C of the user device 114.

The keyboard input component 122 may translate the r received signal into the first key. The user selection of the first key identified may be input for application 126 running on virtual machine 120 or for application 156 running on the user device 114. For example, a user using the keyboard device 105 may press the control key. The keyboard device 105 may generate a signal corresponding to the control key. The keyboard input component 122 may identify (e.g., receive or intercept) the signal for the user selection of the control key and may determine that the first key corresponds to the control key.

At decision block 210, processing logic determines whether the first key is part of a shortcut key combination of the one or more shortcut key combinations. In an implementation, the keyboard input component 122 may determine that the detected first key may be associated with a shortcut key combination based upon the shortcut key combinations stored within the keyboard-remapping table. The keyboard-remapping table may be located within the host computer system 110, within memory associated with the virtual machine 120 or within user device 150. For example, if the first key detected is the control key, then the keyboard input component 122 may check whether the control key is associated with a shortcut key combination by accessing the keyboard-remapping table. If the keyboard input component 122 determines that the first key is associated with a shortcut key combination in the keyboard-remapping table, then the keyboard input component 122 may proceed to decision block 215 to determine whether the current mode of application 126 or 156, for which the first key is provided as input, uses shortcut key combinations. If however, the keyboard input component 122 determines that the first key is not associated with any of the shortcut key combinations within the keyboard-remapping table, then the keyboard input component may immediately send the first key to either the guest operating system 124 or the operating system 154 of the user device 150 without waiting for another user selection (block 220).

At decision block 215, processing logic determines whether the system cursor is visible in a user interface provided by an application. In an embodiment, the keyboard input component 122 may determine whether the system cursor is visible within the current user interface of application 126 or 156 by determining a state of the system cursor. As will be discussed in more detail below, the state of the system cursor may be set by the application when the mode of the application changes. For example, the state of the cursor may change when the application enters a text editing mode from a graphic mode, vice versa.

If the keyboard input component 122 determines that the cursor is visible within the currently mode of application, then the keyboard input component 122 may determine that the application currently supports shortcut key combinations or has its own key remapping logic. If, however, the keyboard input component 122 determines that the cursor is not visible, such as the cursor was set to hide or the cursor bitmap values are set to zero thus making it invisible, then the keyboard input component 122 may determine that the current mode of the application does not support shortcut key combinations or does not have its own key remapping logic.

In an embodiment, the keyboard input component 122 may determine the cursor state by implementing a listener to listen for system calls that update the state of the operating system cursor. For example, the listener of the keyboard input component 122 may listen for system calls such as the Microsoft Windows function "System.showCursor(O)", where the function System.showCursor( ) is used to show or hide the system cursor. The input parameter for System-.showCursor( ) is a Boolean value where I would display the system cursor and O would hide the system cursor. Examples of system function calls are not limited to Microsoft Windows functions. The keyboard input component 122 may implement listeners configured to listen for various types of system function calls that either hide the system cursor or otherwise make the system cursor invisible. For example, the keyboard input component 122 may listen for system function calls that make the system cursor invisible by either setting the cursor bitmap value(s) to zero or by setting the alpha channel of the system cursor to transparent.

In another embodiment, the keyboard component 122 may determine the cursor state by executing a system call to retrieve the state of the system cursor. For example, the keyboard component 122 may execute the Microsoft Windows function System.GetCursorInfo to retrieve cursor information about the visibility of the system cursor.

As discussed above, if the keyboard input component 122 determines that the system cursor is not visible, then the keyboard input component 122 would determine that the current mode of the application does not support shortcut key combinations for the currently displayed user interface and would proceed to block 220. At block 220, processing logic sends the first key to the operating system without waiting for a user selection of another key that may be one or more remaining keys of a shortcut key combination. In an embodiment, the keyboard input component 122 may immediately send the first key to the guest operating system 124 without waiting to determine whether a second key is detected and whether the second key is a key associated with a shortcut key combination.

If however, keyboard input component 122 determines that the system cursor is visible, then the keyboard input component 122 would determine that the current mode of application supports shortcut key combinations for the currently displayed user interface and would proceed to block 225. At block 225 processing logic stalls a timer and waits for a keyboard event of a user selection of one or more remaining keys of the shortcut key combinations for a predetermined time before sending the first key to the operating system. The one or more remaining keys may refer to a second key that may be associated, along with the first key, with a shortcut key combination. In an embodiment, the keyboard input component 122 may wait for a predefined period of time to detect a second key in order to determine whether the first key and the second key map to a shortcut key combination.

At decision block 230 processing logic determines if a second keyboard event occurs (e.g. the user selects a second key) within a threshold amount of time from the selection of the first key at block 205. If no second key is selected within the threshold amount of time, processing logic proceeds to block 220 and sends the first key to the operating system. If, on the other hand, the second key is selected within the threshold amount of time from the selection of the first key, processing logic verifies at block 240 that the first key and the second key constitute a shorthand key combination by checking the shortcut-remapping table for shortcut key combinations mapped to the first key and the second key and provides this identified remapped key combination to the operating system.

Figure 3:
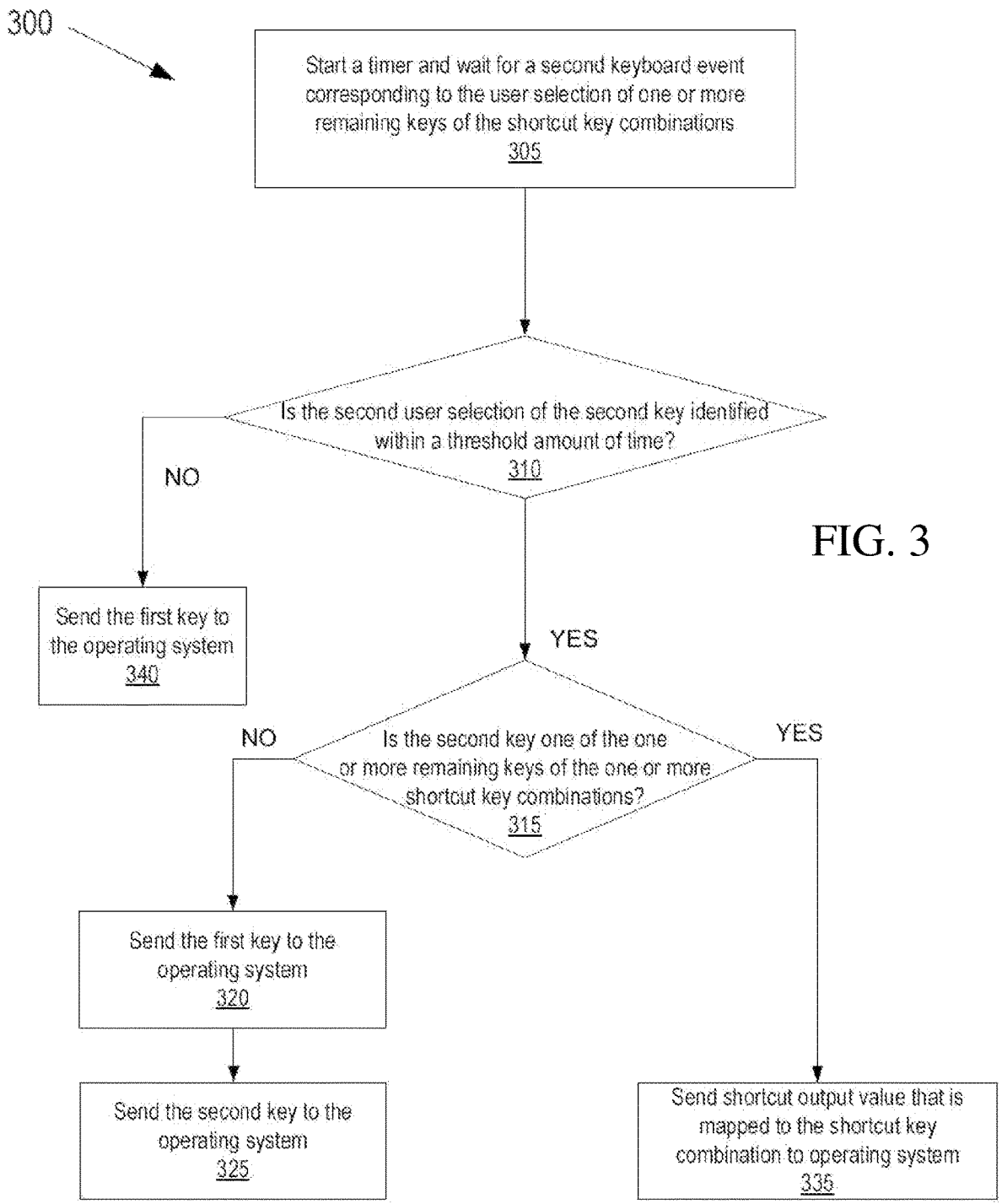
FIG. 3 depicts a flow diagram of one illustrative example of a method for receiving a second user input, in accordance with one or more implementations of the present disclosure.

FIG. 3 depicts a flow diagram of one illustrative example of a method 300 for receiving a second user input and determining how to send the first key to the operating system in an instance where processing logic determines (e.g. in step 215 of FIG. 3) that the system cursor is visible. Method 300 and/or each of its individual functions, routines, subroutines, or operations may be performed by one or more processing units of the host computer system 110 or the computer system 150 implementing the method. In certain implementations, method 300 may be performed by a single processing thread. Alternatively, method 300 may be performed by two or more processing threads, each thread executing one or more individual functions, routines, subroutines, or operations of the method. In an illustrative example, the processing threads implementing method 300 may be synchronized (e.g., using semaphores, critical sections, and/or other thread synchronization mechanisms). Alternatively, the processing threads implementing method 300 may be executed asynchronously with respect to each other.

At block 305 (corresponding to block 225 of FIG. 2), processing logic starts a timer and waits for a keyboard event of a second user selection of one or more remaining keys that may map, along with the first key, to one or more shortcut key combinations. At block 305, processing logic may identify a second keyboard event corresponding to a second user selection of a second key on the keyboard of the user device. In an embodiment, the keyboard input component 122 may identify a second signal from the keyboard device 105 and may translate the second signal into the second key.

At decision block 310, processing logic may determine whether the second key was identified within a threshold amount of time to qualify as a possible key combination with the first key. In an embodiment, the keyboard input component 122 may wait for a predefined period of time, referred to as the threshold amount of time, for a second key in order to determine whether the first key and the second key may be a shortcut key combination. If the second key is detected within the threshold amount of time, then the keyboard input component 122 may proceed to decision block 315 to determine whether the second key is one of the remaining keys of one or more shortcut key combinations.

If however, the second key is detected after the threshold amount of time has then the keyboard input component 122 may determine that the second key is not part of a possible shortcut key combination with the first key detected. Upon determining that the second key is not part of a possible shortcut key combination with the first key, the keyboard input component 122 may send the first key to the guest operating system 124 or the operating system 154 of the user device 150 (block 320) and the second key to the guest operating system 124 or the operating system 154 of the user device 150 respectively (block 325).

Upon determining that the second key was detected within the threshold amount of time, processing logic proceeds to decision block 315. At decision block 315, processing logic determines whether the second key detected is part of a shortcut key combination with the first key. In an embodiment, the keyboard input component 122A may determine whether the second key and the first key make up a shortcut key combination by checking the shortcut-remapping table for shortcut key combinations mapped to the first key and the second key. If the combination of the first key and second key matches a shortcut key combination in the shortcut-remapping table, then the keyboard input component 122 may proceed to block 335 to send an output value for the matched shortcut key combination to the guest operating system 124 or the operating system 154 of the user device 150, respectively. If however, the combination of the first key and the second key does not match a shortcut key combination in the shortcut-remapping table, then the keyboard input component 122 may conclude that the first key and second key are not part of a shortcut key combination and may proceed to blocks 320 and 325 to individually send the first key and the second key to the guest operating system 124 or the operating system 154 of the user device 150, respectively.

Upon determining that the first key and the second key map to a shortcut key combination, processing logic may determine the shortcut key combination mapped to the first key and the second key. In an embodiment, the keyboard input component 122 may retrieve the shortcut key command from the shortcut-remapping table that matches the combination of the first key and the second key. For example, if the first key is the CONTROL-key and the second key is the O-key, or any other remapped key combination, then the keyboard input component 122 may access the shortcut-remapping table to retrieve the shortcut key command mapped to the combination of the CONTROL-key and the O-key, which may be a file-open command, or any other command. In an embodiment, the keyboard input component 122 may send the shortcut key command to the guest operating system 124 or the operating system 154 of the user device 150, respectively. Using the current example, if the keyboard input component 122 determined that the first key (CONTROL-key) and the second key (O-key) mapped to the shortcut key command (e.g. file open), then the keyboard input component 122 would send the file open command, or any other remapped key combination, directly to the guest operating system 124 or the operating system 154 of the user device 150, which will send it to the current active application 126 or 156, respectively.

Referring back to decision block 315, if the keyboard input component 122 determines that the second key and the first key do not map to one or more shortcut key combinations, then the keyboard input component 122 proceeds to block 320 to individually send the first and second key to the guest operating system 124 or the operating system 154 of the user device 150. At block 320, processing logic sends the first key to the operating system. In an embodiment, the keyboard input component 122 sends a value corresponding to the first key to the guest operating system 124 or the operating system 154 of the user device 150. At block 325, processing logic sends the second key to the operating system. In an embodiment, the keyboard input component 122A sends the value corresponding to the second key to the guest operating system 124 or the operating system 154 of the user device 150. For example, if the first key is the control key and the second key is the spacebar key, and the combination of the control key and the spacebar key does not match any shortcut key combinations, then the keyboard input component 122 may individually send the control key to the guest operating system 124 or the operating system 154 of the user device 150 (block 320) and then send the spacebar key to the guest operating system 124 or the operating system 154 of the user device 150 (block 325).

Figure 4:
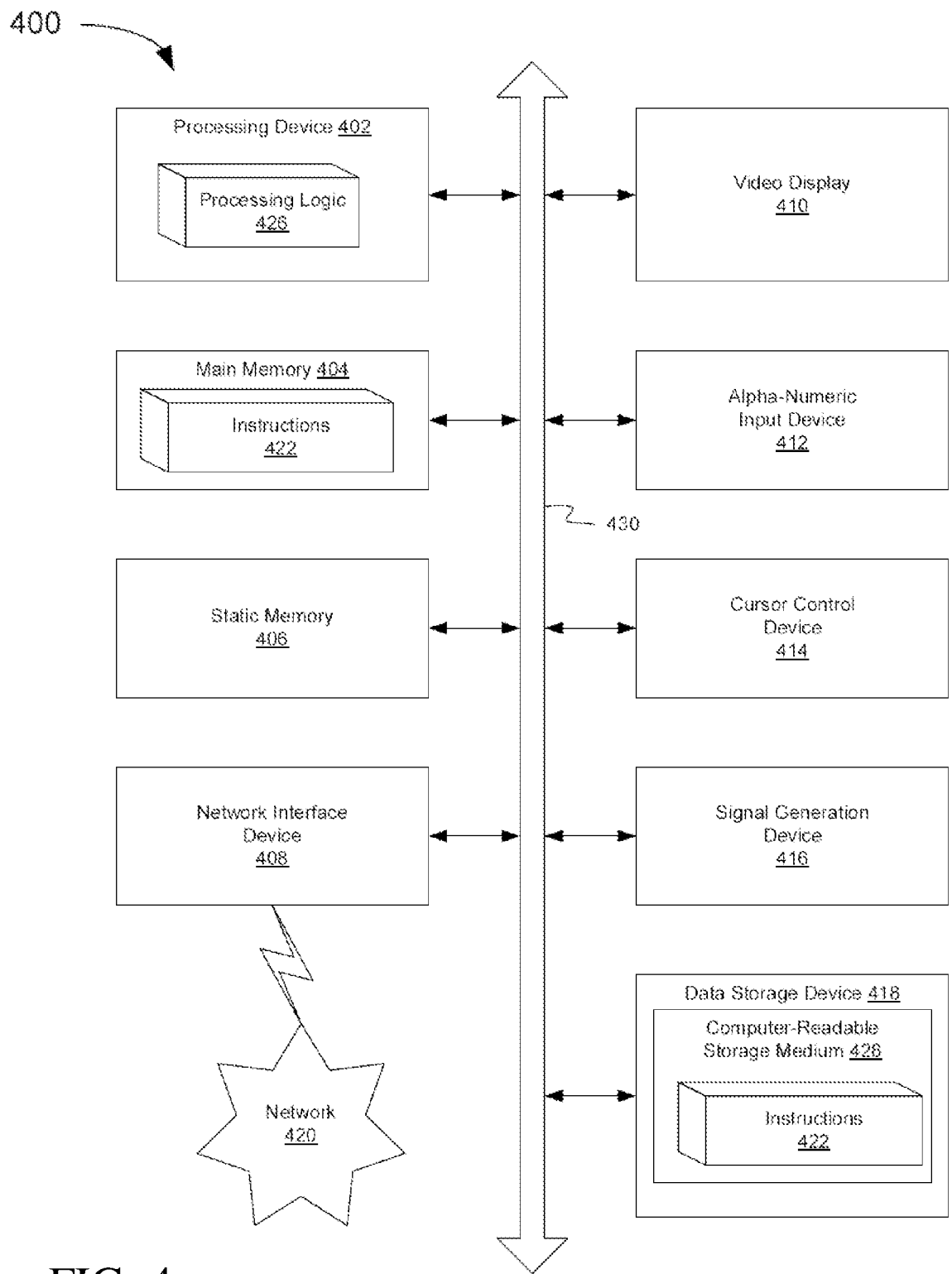
FIG. 4 depicts a block diagram of an example computer system operating in accordance with one or more aspects of the present disclosure.

FIG. 4 schematically illustrates a component diagram of an example computer system 400 which may perform any one or more of the methods described herein. In various illustrative examples, computer system 400 may represent the host computer system 110 and/or the computer system 150 of FIGS. 1A and 1B.

Example computer system 400 may be connected to other computer systems in a LAN, an intranet, an extranet, and/or the Internet. Computer system 400 may operate in the capacity of a server in a client-server network environment. Computer system 400 may be a personal computer (PC), a set-top box (STB), a server, a network router, switch or bridge, or any device capable of executing a set of instructions (sequential or otherwise) that specify actions to be taken by that device. Further, while only a single example computer system is illustrated, the term "computer" shall also be taken to include any collection of computers that individually or jointly execute a set (or multiple sets) of instructions to perform any one or more of the methods discussed herein.

Example computer system 400 may comprise a processing device 402 (also referred to as a processor or CPU), a main memory 404 (e.g., read-only memory (ROM), flash memory, dynamic random access memory (DRAM) such as synchronous DRAM (SDRAM), etc.), a static memory 406 (e.g., flash memory, static random access memory (SRAM), etc.), and a secondary memory (e.g., a data storage device 418), which may communicate with each other via a bus 430.

Processing device 402 represents one or more general-purpose processing devices such as a microprocessor, central processing unit, or the like. More particularly, processing device 402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 402 may also be one or more special-purpose processing devices such as an application specific integrated circuit (AMC), a field programmable gate array (FPGA), a digital signal processor (DSP), network processor, or the like. In accordance with one or more aspects of the present disclosure, processing device 402 may be configured to execute instructions implementing method 200 for receiving a second user input and/or method 300 of delivering application containers to the client device.

Example computer system 400 may further comprise a network interface device 408, which may be communicatively coupled to a network 420. Example computer system 400 may further comprise a video display 410 (e.g., a liquid crystal display (LCD), a touch screen, or a cathode ray tube (CRT)), an alphanumeric input device 412 (e.g., a keyboard), a cursor control device 414 (e.g., a mouse), and an acoustic signal generation device 416 (e.g., a speaker).

Data storage device 418 may include a computer-readable storage medium (or more specifically a non-transitory computer-readable storage medium) 428 on which is stored one or more sets of executable instructions 422. In accordance with one or more aspects of the present disclosure, executable instructions 422 may comprise executable instructions implement method 400 of initiating application execution in a client-server virtual execution environment, and/or method 400 of delivering application containers to the client device, and/or method 600 of periodic monitoring of remote server's performance.

Executable instructions 422 may also reside, completely or at least partially, within main memory 404 and/or within processing device 402 during execution thereof by example computer system 400, main memory 404 and processing device 402 also constituting computer-readable storage media. Executable instructions 422 may further be transmitted or received over a network via network interface device 408.

While computer-readable storage medium 428 is shown in FIG. 4 as a single medium, the term "computer-readable storage medium" should be taken to include a single medium or multiple media (e.g., a centralized or distributed and/or associated caches and servers) that store the one or more sets of VM operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions Of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method for determining when to send a user selection of a first key on a keyboard to an operating system, the method comprising:
    identifying, by a processing device executing a keyboard component associated with a first operating system of a computing device, a first keyboard event corresponding to the user selection of the first key as input for an application rendered to the user within a graphical user interface (GUI) upon a display, wherein the operating system supports a plurality of shortcut key combinations;
    determining, by the keyboard component, whether the first key is part of a shortcut key combination of the one or more shortcut key combinations; and
    upon a negative determination sending the first key to a second operating system immediately, and if otherwise then executing a process; wherein
    the process comprises the steps of:
        determining, when the first key was selected, whether the application was in a text inputting mode;
        upon a negative determination that the application was in a text inputting mode sending the first key to the second operating system immediately and exiting the process;
        determining, when the first key was selected, whether a cursor was visible within the GUI;
        upon a negative determination that the cursor was visible within the GUI sending the first key to the second operating system immediately and exiting the process;
        determining, by the keyboard component, whether a second keyboard event corresponding to a user selection of another key occurs within a threshold time from the first keyboard event;
        upon a negative determination sending the another key to the second operating system and exiting the process otherwise continuing the process;
        determining whether the first key and another key are part of a shortcut key combination of the plurality of shortcut key combinations; and
        upon a positive determination sending the shortcut key combination of the plurality of shortcut key combinations comprising the first key and the second key to the first operating system, and if otherwise then sending the first key and the second key to the second operating system;
    the determinations are made independent of any aspects of a current mode of the application other than that the current mode supports shortcut key combinations; and
    either:
        the second operating system is an operating system associated with an application in execution upon a virtual machine and the computing device is an electronic device associated with the user comprising the display and upon which the first keyboard event and second keyboard event occur;
    or:
        the first operating system is an operating system associated with an application in execution upon a virtual machine and the second operating system is associated with an electronic device associated with the user comprising the display and upon which the first keyboard event and second keyboard event occur.

2. A method for determining when to send a user selection of a first key on a keyboard to an operating system, the method comprising the steps:
    identifying, by a processing device executing a keyboard component associated with a first operating system of a computing device, a first keyboard event corresponding to the user selection of the first key as input for an application, wherein the operating system supports a plurality of shortcut key combinations;
    determining, when the first key was selected, whether the application was in a text inputting mode;
    upon a negative determination that the application was in a text inputting mode sending the first key to the second operating system immediately and terminating;
    determining, when the first key was selected, whether a cursor was visible within the GUI;
    upon a negative determination that the cursor was visible within the GUI sending the first key to the second operating system immediately and terminating;
    determining whether the first key is part of one or more shortcut key combinations of the plurality of shortcut key combinations;
    upon a negative determination sending the first key to a second operating system immediately, and if otherwise then executing a process; wherein
    the process comprises the steps of:
        waiting for a second keyboard event corresponding to a user selection of a second key;
        while waiting for the user selection of the another key determining, by the keyboard component, whether a threshold amount of time allotted for receiving the user selection of the second key has been exceeded;
        upon a determination that the threshold amount of time allotted for receiving the user selection of the second key has been exceeded sending the first key to the second operating system;
        upon a determination that the user selection of the second key has been made within the threshold amount of time determining whether the second key is part of a shortcut key combination of the one or more shortcut key combinations of the plurality of shortcut key combinations of which the first key forms part;
        upon a determination that the second key is not part of the one or more shortcut key combinations of the plurality of shortcut key combinations of which the first key forms part sending the first key and second key to the second operating system; and upon a determination that the second key is part of the shortcut key combination of the one or more shortcut key combinations of the plurality of shortcut key combinations of which the first key forms part sending to the first operating system a shortcut output value that is mapped to the shortcut key combination of the one or more shortcut key combinations of the plurality of shortcut combinations of which the first key and second key each form part; wherein either:
    the second operating system is an operating system associated with an application in execution upon a virtual machine and the computing device is an electronic device associated with the user comprising the display and upon which the first keyboard event and second keyboard event occur;

or:
    the first operating system is an operating system associated with an application in execution upon a virtual machine and the second operating system is associated with an electronic device associated with the user comprising the display and upon which the first keyboard event and second keyboard event occur.

3. The method according to claim 2, wherein the determinations are made independent of any other aspect of a current mode of the application other than that the current mode supports shortcut key combinations.

4. A method for determining when to send a user selection of a first key on a keyboard to an operating system, the method comprising:

identifying, by a processing device executing a keyboard component associated with a first operating system of a computing device, a first keyboard event corresponding to the user selection of the first key as input for an application rendered to the user within a graphical user interface (GUI) upon a display, wherein the first operating system supports one or more shortcut key combinations;

determining, when the first key was selected, whether the application was in a text inputting mode;

upon a negative determination that the application was in a text inputting mode sending the first key to the second operating system immediately and terminating;

determining, when the first key was selected, whether a cursor was visible within the GUI;

upon a negative determination that the cursor was visible within the GUI sending the first key to the second operating system immediately and terminating;

determining, by the keyboard component, whether the first key is part of a shortcut key combination of the one or more shortcut key combinations;

upon a negative determination sending the first key to a second operating system immediately, and if otherwise then executing a process; wherein the process comprises the steps of:
    determining, by the keyboard component, whether a second keyboard event corresponding to a user selection of one or more remaining keys of the shortcut key combination occurs within a threshold time from the first keyboard event;

upon a negative determination that the second keyboard event occurred within the threshold time from the first keyboard event or upon a negative determination that the second keyboard event corresponds to a user selection of one or more remaining keys of the shortcut key combination, sending the first key to the second operating system;

upon a positive determination that the second keyboard event corresponds to a user selection of one or more remaining keys of the shortcut key combination, and occurs within the threshold time from the first keyboard event, sending the shortcut key combination to the first operating system; wherein:

the determinations are made independent of any other aspect of a current mode of the application other than that the current mode supports shortcut key combinations; and either:
    the second operating system is an operating system associated with an application in execution upon a virtual machine and the computing device is an electronic device associated with the user comprising the display and upon which the first keyboard event and second keyboard event occur;

or:
    the first operating system is an operating system associated with an application in execution upon a virtual machine and the second operating system is associated with an electronic device associated with the user comprising the display and upon which the first keyboard event and second keyboard event occur.

\* \* \* \* \*